(12) United States Patent
Wan et al.

(10) Patent No.: US 7,299,165 B1
(45) Date of Patent: Nov. 20, 2007

(54) SYSTEM, METHOD, AND COMPUTER PROGRAM PRODUCT FOR IDENTIFYING MANUFACTURING-SPECIFIC REGIONS IN OBJECT MODELS

(75) Inventors: Jun Wan, Cerritos, CA (US); Chee-Keong Chong, Irvine, CA (US)

(73) Assignee: UGS Corp., Plano, TX (US)

( * ) Notice: Subject to any disclaimer, the term of this patent is extended or adjusted under 35 U.S.C. 154(b) by 495 days.

(21) Appl. No.: 10/687,556

(22) Filed: Oct. 16, 2003

(51) Int. Cl.
  *G06G 7/48* (2006.01)
(52) U.S. Cl. .......................................... 703/6; 345/419
(58) Field of Classification Search ................ 703/2, 703/22, 6; 345/419, 420, 423; 700/182; 707/4; 715/968; 382/118
See application file for complete search history.

(56) References Cited

U.S. PATENT DOCUMENTS

| | | | |
|---|---|---|---|
| 6,614,926 B1 | 9/2003 | Fix et al. | |
| 6,704,693 B1 | 3/2004 | Fan et al. | |
| 6,754,556 B1* | 6/2004 | Landers et al. | 700/182 |
| 6,792,135 B1* | 9/2004 | Toyama | 382/118 |
| 6,879,324 B1* | 4/2005 | Hoppe | 345/423 |
| 6,950,719 B2* | 9/2005 | Landers et al. | 700/182 |
| 6,985,793 B2* | 1/2006 | Landers et al. | 700/182 |
| 7,129,942 B2* | 10/2006 | Martin | 345/423 |
| 2004/0153200 A1* | 8/2004 | Landers et al. | 700/182 |
| 2004/0153201 A1* | 8/2004 | Landers et al. | 700/182 |
| 2004/0153202 A1* | 8/2004 | Landers et al. | 700/182 |

OTHER PUBLICATIONS

Woodwark, J. Shape models in Computer Integrated Manufacture—A review, Computer-Aided Engineering Journal, vol. 5, Iss. 3, Jun. 1988, pp. 103-112.*
Edelsbrunner et al., H. The Complexity of many Faces in Arrangements of Lines and Segments, ACM, Proceedings of the Fourth Annual Symposium on Computational Geometry, Jan. 1988, pp. 44-55.*
Higashi et al., M. Face-Based Data Structure and its Application to Robust Geometric Modeling, ACM, Proceedings of the Third ACM Symposium Modeling and Applications, Dec. 1995, pp. 235-246.*
AHN et al., H.K. Separating an Object from its Cast, ACM, Proceedings of the 13th Annual Symposium on Computational Geometry, Aug. 1997, pp. 221-230.*
Serratosa et al., F. Function-Described Graphs for Modelling Objects Represented by Sets of Attributed Graphs, Pattern Recognition, vol. 36, Iss. 3, Mar. 2003, pp. 781-798.*

* cited by examiner

Primary Examiner—Russell Frejd

(57) ABSTRACT

A system, method, and computer program product for decomposing a product model into manufacturing specific regions, including a corresponding system, method, and computer program product incorporating an object view visualization method for decomposing a product model into manufacturing specific regions.

18 Claims, 2 Drawing Sheets

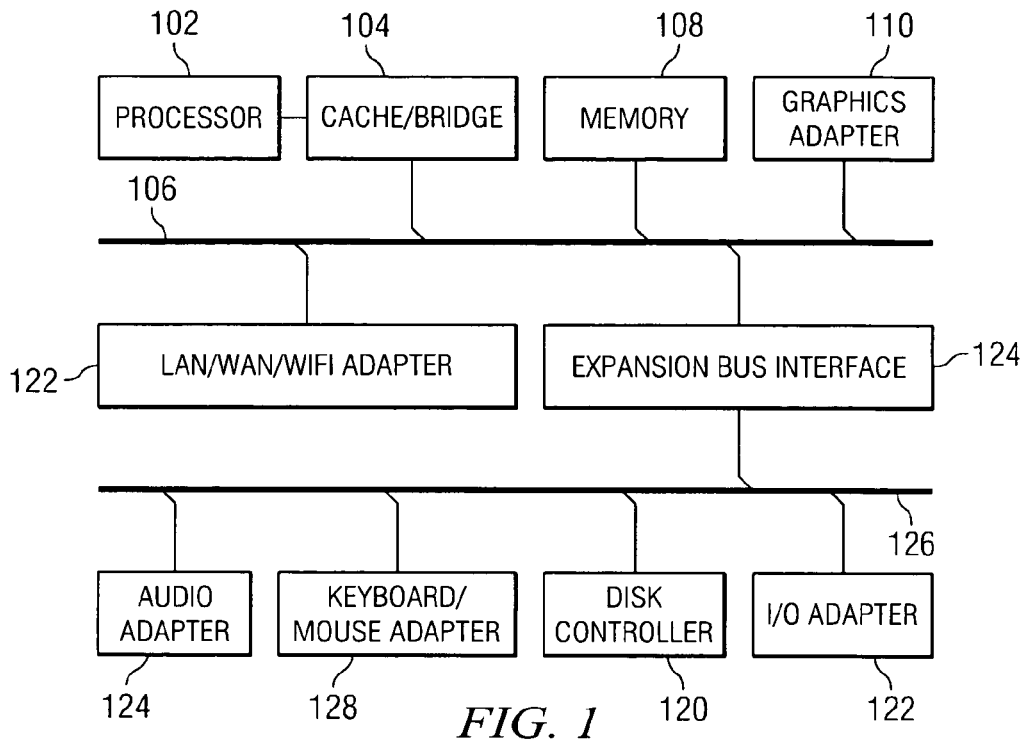
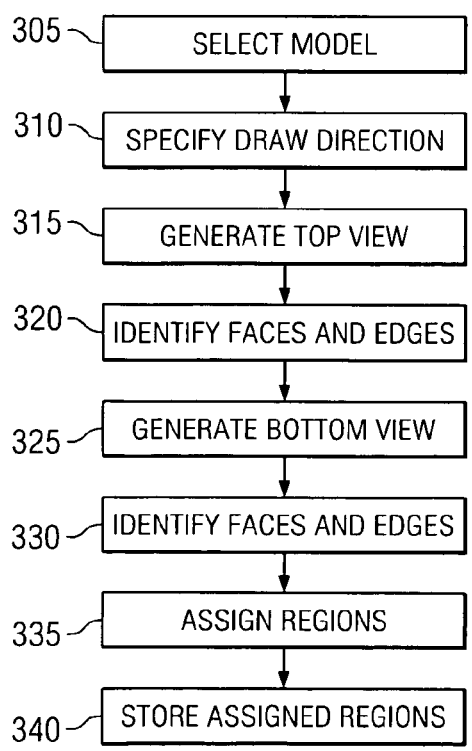
FIG. 1
FIG. 3

SYSTEM, METHOD, AND COMPUTER PROGRAM PRODUCT FOR IDENTIFYING MANUFACTURING-SPECIFIC REGIONS IN OBJECT MODELS

TECHNICAL FIELD OF THE INVENTION

The present invention is directed, in general, to computer-aided design and modeling.

BACKGROUND OF THE INVENTION

Computer-aided design and modeling (CAD/CAM) have become an integral part of the process for designing and manufacturing any number of components. By designing, modeling, and revising the components in a data processing system, the product can be visualized and optimized as it is being developed to ensure a correct design before any actual manufacturing takes place.

The ability to quickly find potential design problems which will impact manufacturing with high costs or other problems is a great advantage during this process. To validate designed product models, it is necessary to define the character of each face and edge to determine the interrelation of each modeled part. There is currently no accurate, automated method for finding manufacturing related features such as parting lines, undercuts, crossover faces, cavity and core regions.

There is, therefore, a need in the art for a system, process and computer program product for enabling an efficient and automated identification and characterization of the above manufacturing related features in product models.

SUMMARY OF THE INVENTION

A preferred embodiment provides a system, method, and computer program product for decomposing a product model into manufacturing specific regions. Further, a preferred embodiment provides a corresponding system, method, and computer program product incorporating an object view visualization method for decomposing a product model into manufacturing specific regions.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which:

FIG. 1 depicts a block diagram of a data processing system in which a preferred embodiment can be implemented;

FIG. 3 shows a flowchart of a process in accordance with a preferred embodiment.

DETAILED DESCRIPTION OF THE INVENTION

Figure 2B:
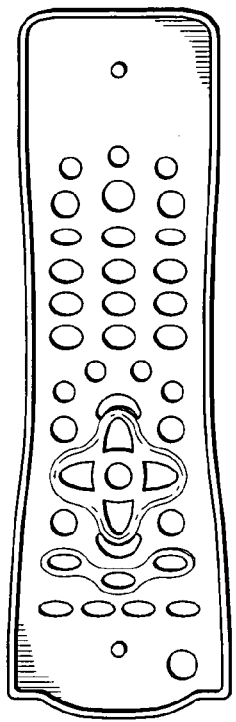
FIGS. 2A-2E illustrate an exemplary model as decomposed into cavity and core regions.

FIGS. 1 through 3, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device. The numerous innovative teachings of the present application will be described with particular reference to the presently preferred embodiment.

A preferred embodiment provides a system, method, and computer program product for decomposing product a model into manufacturing specific regions. Further, a preferred embodiment provides a corresponding system, method, and computer program product incorporating an object view visualization method for decomposing a product model into manufacturing specific regions.

The disclosed method and system helps plastic and casting parts design engineers to easily find potential design problems that could affect manufacturing, and helps achieve product design optimization early as in the design stage. By using this system, mold/tooling design engineers can quickly find cavity/core regions and parting lines when designing cavities and cores, so productivity will be significantly improved.

FIG. 1 depicts a block diagram of a data processing system in which a preferred embodiment can be implemented. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 416 is connected to keyboard/mouse adapter 118, disk controller 120, and I/O adapter 122.

Also connected to I/O bus 116 in the example shown is audio adapter 124, to which speakers (not shown) may be connected for playing sounds. Keyboard/mouse adapter 418 provides a connection for a pointing device (not shown), such as a mouse, trackball, trackpointer, etc.

Those of ordinary skill in the art will appreciate that the hardware depicted in FIG. 1 may vary for particular. For example, other peripheral devices, such as an optical disk drive and the like, also may be used in addition or in place of the hardware depicted. The depicted example is provided for the purpose of explanation only and is not meant to imply architectural limitations with respect to the present invention.

A data processing system in accordance with a preferred embodiment of the present invention includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present invention as described.

A disclosed method includes decomposing a product model into manufacturing-specific sub-regions, according to typical manufacturing operations requirements.

The sub regions are described in Table 1:

| Region Category | Manufacturing property |
| --- | --- |
| Cavity faces | Formed in cavity side |
| Core faces | Formed in core side |
| Parting lines | Outer boundary of cavity and core regions |
| Patch loops | Inner boundary of cavity and core regions |
| Crossover region faces | Need to be split and formed in both sides |
| Crossover vertical faces | Need draft added or formed in one side |
| Undercut faces | Need slide or lifter system operation |
| Undercut edges | Will bring undercut faces |

As shown in Table 1 and understood by skilled artisans, cavity and core faces are used for cavity and core design of molds and tools respectively, and must be identified and extracted out as cavity and core regions for mold/tool design.

Parting lines are the boundary (with maximum length) of cavity and core regions, from which parting surfaces will be created. Patch loops are the boundaries of cavity and core regions other than parting lines, and are used to create patch surfaces for mold/tool design.

Crossover region faces are the faces which partly stay in cavity side and partly stay in core side, so they need to be split in the middle (along isocline) to avoid undercuts for mold/tool release. Crossover vertical faces are the faces without draft, they need to have draft added or assigned either in the cavity side or the core side.

Undercut faces need special mechanism systems (lifter or slider) in mold/tool design, which incur a correspondingly high cost. Unnecessary undercuts need to be removed in product design to achieve design optimization. Undercut edges are used to help identify undercut faces.

An object view visualization method is used to decompose a product model into manufacturing-specific regions. The method is described below:

First, based on draw (mold release) direction, the top and bottom views for the product model are generated. Visible and invisible faces and edges of the product model in each view are determined and assigned an object name as shown in Table 2:

| Object Name | Visibility in view |
| --- | --- |
| F1 | Top view visible face |
| F2 | Bottom view visible face |
| E1 | Top view visible edge |
| E2 | Bottom view visible edge |

Next, a set of rules is used to automatically assign the above-listed manufacturing specific regions from the product model. These rules are shown in Table 3 below:

| Category | Rule |
| --- | --- |
| Cavity face | F1 only |
| Core face | F2 only |
| Crossover face | F1 and F2 |
| Undercut face | Non F1 and Non F2 |
| Undercut EDGE | Non E1 and Non E2 |
| Parting EDGE | Its adjacent faces belong to the cavity and core faces respectively |
| Parting line loop | Maximum loop length against draw direction. |
| Patch loop | Loop other than the parting line loop. |

Figure 2A:
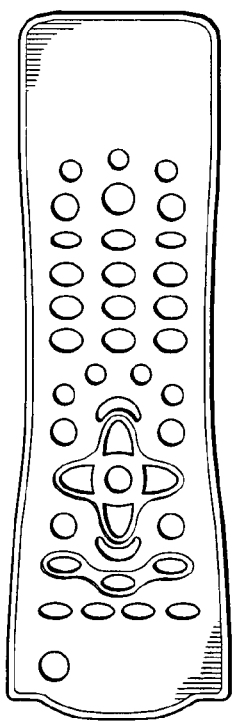
Figure 2C:
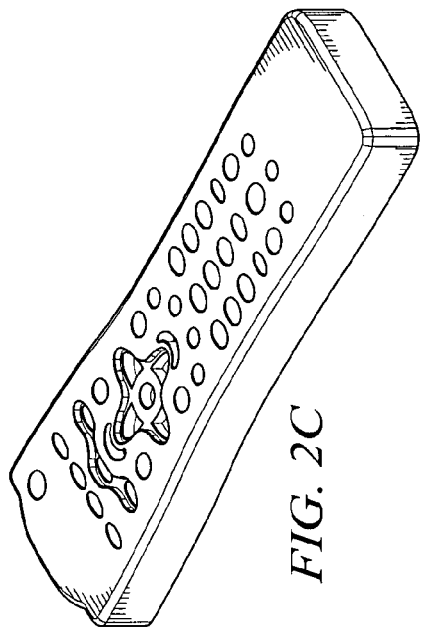
Figure 2D:
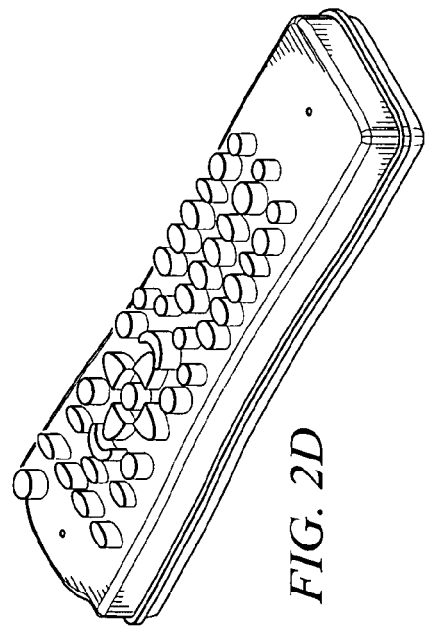
Figure 2E:
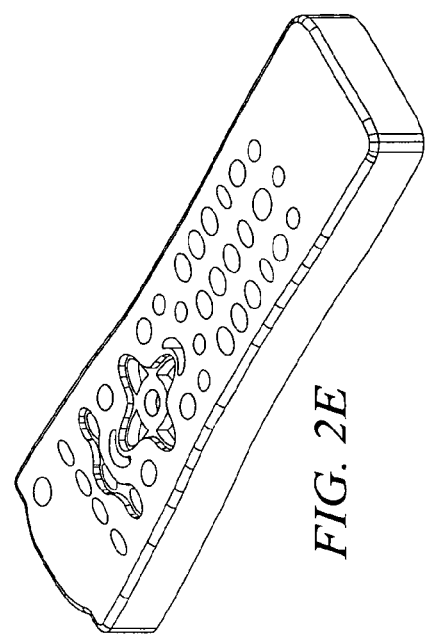

FIGS. 2A-2E illustrate an exemplary model as decomposed into cavity and core regions. FIG. 2A shows the product model in top view. FIG. 2B shows the product model in bottom view. FIG. 2C shows the cavity region of the product model. FIG. 2D show the core region of the model. FIG. 2E shows the parting lines and patch loops of the product model.

The disclosed system and method provides a much more accurate solution in finding parting lines, undercuts, crossover faces than many of the existing solutions. In current solutions addressing the above issue, classification of faces in the product model is through the use of face draft analysis. Based on the results of face draft analysis, faces are first put into the positive and negative groups. Next, the positive faces are assumed to be the cavity faces, and negative faces for the core faces. This assumption may not be always correct because a positive face may be a core face and a negative face may be a cavity face. Therefore, those solutions will often generate incorrect results in finding parting lines and undercuts.

The disclosed system and method can automatically recognize cavity and core regions, a capability unavailable in the current product market.

FIG. 3 shows a flowchart of a process in accordance with a preferred embodiment. Here, the system will first select a product solid model, either automatically or by receiving a user selection (step 305). A draw direction (mold release direction) will then be specified, either by the user or according to the model design file (step 310).

The system will then generate top view (step 315) and identify all faces and edges of model which are visible in top view (step 320). The outputs will be as shown in Table 2: F1, Non F1, E1 and Non E1.

The system will then generate bottom view (step 325) and identify all faces and edges of model which are visible in bottom view (step 330). As above, the outputs will be as shown in Table 2: F2, Non-F2, E2 and Non-E2.

The system will then assign manufacturing-specific regions to each face and edge based on the rules shown in Table 3, above (step 335).

The rules are preferably applied in the following sequence:
1) If a face is <F1 only>, then it is assigned to the Cavity Face region.
2) If a face is <F2 only>, then it is assigned to the Core Face region.
3) If a face is <F1 and F2>, then it is assigned to the Crossover Face region.
4) If a face is <Non-F1 and Non-F2>, then it is assigned to the Undercut Face region
5) If an edge is <Non-E1 and Non-E2>, then it is assigned to the Undercut Edge region.
6) If an edge has its two adjacent faces belonging to a cavity and a core face each, then it is assigned to the Parting Edge region.
7) Parting loops are comprised of parting edges, among all parting loops. A Parting Line Loop is defined as the one with maximum loop length against the draw direction.
8) After the parting line loop is identified, the other loops are Patch Loops (internal holes).

Finally, the system will store the assigned manufacturing-specific regions (step 340).

Those skilled in the art will recognize that, for simplicity and clarity, the full structure and operation of all data processing systems suitable for use with the present invention is not being depicted or described herein. Instead, only so much of a data processing system as is unique to the present invention or necessary for an understanding of the present invention is depicted and described. The remainder of the construction and operation of data processing system 100 may conform to any of the various current implementations and practices known in the art.

It is important to note that while the present invention has been described in the context of a fully functional system, those skilled in the art will appreciate that at least portions of the mechanism of the present invention are capable of being distributed in the form of a instructions contained within a machine usable medium in any of a variety of forms, and that the present invention applies equally regardless of the particular type of instruction or signal bearing medium utilized to actually carry out the distribution. Examples of machine usable mediums include: nonvolatile, hard-coded type mediums such as read only memories (ROMs) or erasable, electrically programmable read only memories (EEPROMs), user-recordable type mediums such as floppy disks, hard disk drives and compact disk read only memories (CD-ROMs) or digital versatile disks (DVDs), and transmission type mediums such as digital and analog communication links.

Although an exemplary embodiment of the present invention has been described in detail, those skilled in the art will understand that various changes, substitutions, variations, and improvements of the invention disclosed herein may be made without departing from the spirit and scope of the invention in its broadest form.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC §112 unless the exact words "means for" are followed by a participle.

What is claimed is:

1. A method for object model processing, comprising:
   generating a first view of an object model along a specified direction;
   identifying first-view edges and first-view faces visible in the first view;
   generating a second view, opposite of the first view;
   identifying second-view edges and second-view faces visible in the second view;
   assigning a region to each of the first-view edges, first-view faces, second-view edges, and second-view faces; and
   storing the assigned regions.

2. The method of claim 1, wherein the regions are assigned so that if a face is a first-view face only, then it is assigned to a cavity face region;
   if a face is a second-view face only, then it is assigned to a core face region;
   if a face is a first-view face and a second-view face, then it is assigned to a crossover face region;
   if a face is not a first-view face and not a second-view face, then it is assigned to an undercut face region;
   if an edge is not a first-view edge and not a second-view edge, then it is assigned to an undercut edge region; and
   if an edge has two adjacent faces belonging to a cavity and a core face each, then it is assigned to a parting edge region.

3. The method of claim 1, further comprising identifying parting loops, including a parting line loop and patch loops, wherein parting loops are comprised of parting edges, and a parting line loop is defined as the parting loop with a maximum loop length against the specified direction, and all other loops are assigned as patch loops.

4. The method of claim 1, wherein the first view is a top view and the second view is a bottom view.

5. The method of claim 1, further comprising selecting an object model.

6. The method of claim 1, further comprising specifying a draw direction.

7. A data processing system having at least a processor and accessible memory, comprising:
   means for generating a first view of an object model;
   means for identifying first-view edges and first-view faces visible in the first view;
   means for generating a second view, opposite of the first view;
   means for identifying second-view edges and second-view faces visible in the second view;
   means for assigning a region to each of the first-view edges, first-view faces, second-view edges, and second-view faces; and
   means for storing the assigned regions.

8. The data processing system of claim 7, wherein the regions are assigned so that
   if a face is a first-view face only, then it is assigned to a cavity face region;

if a face is a second-view face only, then it is assigned to a core face region;

if a face is a first-view face and a second-view face, then it is assigned to a crossover face region;

if a face is not a first-view face and not a second-view face, then it is assigned to an undercut face region;

if an edge is not a first-view edge and not a second-view edge, then it is assigned to an undercut edge region; and if an edge has two adjacent faces belonging to a cavity and a core face each, then it is assigned to a parting edge region.

9. The data processing system of claim 7, further comprising means for identifying parting loops, including a parting line loop and patch loops, wherein parting loops are comprised of parting edges, and a parting line loop is defined as the parting loop with a maximum loop length against the specified direction, and all other loops are assigned as patch loops.

10. The data processing system of claim 7, wherein the first view is a top view and the second view is a bottom view.

11. The data processing system of claim 7, further comprising means for selecting an object model.

12. The data processing system of claim 7, further comprising means for specifying a draw direction.

13. A computer program product tangibly embodied in a computer-readable medium, comprising:

instructions for generating a first view of an object model;

instructions for identifying first-view edges and first-view faces visible in the first view;

instructions for generating a second view, opposite of the first view;

instructions for identifying second-view edges and second-view faces visible in the second view;

instructions for assigning a region to each of the first-view edges, first-view faces, second-view edges, and second-view faces; and instructions for storing the assigned regions.

14. The computer program product of claim 13, wherein the regions are assigned so that if a face is a first-view face only, then it is assigned to a cavity face region;

if a face is a second-view face only, then it is assigned to a core face region;

if a face is a first-view face and a second-view face, then it is assigned to a crossover face region;

if a face is not a first-view face and not a second-view face, then it is assigned to an undercut face region;

if an edge is not a first-view edge and not a second-view edge, then it is assigned to an undercut edge region; and if an edge has two adjacent faces belonging to a cavity and a core face each, then it is assigned to a parting edge region.

15. The computer program product of claim 13, further composing instructions for identifying parting loops, including a parting line loop and patch loops, wherein parting loops are comprised of parting edges, and a parting line loop is defined as the parting loop with a maximum loop length against the specified direction, and all other loops are assigned as patch loops.

16. The computer program product of claim 13, wherein the first view is a top view and the second view is a bottom view.

17. The computer program product of claim 13, further comprising instructions for selecting an object model.

18. The computer program product of claim 13, further comprising instructions for specifying a draw direction.

* * * * *